(12) United States Patent
Van Der Wiel

(10) Patent No.: US 11,195,772 B2
(45) Date of Patent: Dec. 7, 2021

(54) CMOS BASED DEVICES FOR HARSH MEDIA

(71) Applicant: Melexis Technologies NV, Tessenderlo (BE)

(72) Inventor: Appolonius Jacobus Van Der Wiel, Duisburg (BE)

(73) Assignee: MELEXIS TECHNOLOGIES NV, Tessenderlo (BE)

( * ) Notice: Subject to any disclaimer, the term of this patent is extended or adjusted under 35 U.S.C. 154(b) by 174 days.

(21) Appl. No.: 16/441,743

(22) Filed: Jun. 14, 2019

(65) Prior Publication Data

US 2019/0385923 A1    Dec. 19, 2019

(30) Foreign Application Priority Data

Jun. 15, 2018 (EP) ..................... 18178062

(51) Int. Cl.
*H01L 29/84* (2006.01)
*H01L 23/31* (2006.01)
(Continued)

(52) U.S. Cl.
CPC .... *H01L 23/3171* (2013.01); *H01L 21/02274* (2013.01); *H01L 21/76802* (2013.01); *H01L 21/76877* (2013.01); *H01L 23/291* (2013.01); *H01L 23/528* (2013.01); *H01L 23/5226* (2013.01); *H01L 23/53257* (2013.01); *H01L 23/53271* (2013.01); *H01L 24/05* (2013.01); *H01L 29/402* (2013.01); *H01L 29/84* (2013.01); *H01L 37/02* (2013.01); *H01L 2224/05025* (2013.01)

(58) Field of Classification Search
None
See application file for complete search history.

(56) References Cited

U.S. PATENT DOCUMENTS 4,622,735 A    11/1986 Shibata
4,873,204 A *  10/1989 Wong ................ H01L 21/76889
                                                438/649
(Continued)

OTHER PUBLICATIONS

Subbanna et al., "A Novel Borderless Contact/Interconnect Technology Using Aluminum Oxide Etch Stop for High Performance SRAM and Logic," Proceedings of IEEE International Electron Devices Meeting, Dec. 5-8, 1993, pp. 441-444.

(Continued)

*Primary Examiner* — Hung K Vu
(74) *Attorney, Agent, or Firm* — Workman Nydegger

(57) ABSTRACT

A semiconductor device comprises a first doped semiconductor layer, a second doped semiconductor layer, an oxide layer covering the first doped semiconductor layer and the second doped semiconductor layer, and an interconnect. The first doped semiconductor layer is electrically connected with the second doped semiconductor layer by means of the interconnect which crosses over a sidewall of the second doped semiconductor layer. The interconnect comprises a metal filled slit in the oxide layer. At least one electronic component is formed in the first and/or second semiconductor layer. The semiconductor device moreover comprises a passivation layer which covers the first and second doped semiconductor layers and the oxide layer.

15 Claims, 9 Drawing Sheets

(51) Int. Cl.
*H01L 21/02* (2006.01)
*H01L 21/768* (2006.01)
*H01L 23/29* (2006.01)
*H01L 23/522* (2006.01)
*H01L 23/528* (2006.01)
*H01L 23/532* (2006.01)
*H01L 23/00* (2006.01)
*H01L 29/40* (2006.01)
*H01L 37/02* (2006.01)

(56) References Cited

U.S. PATENT DOCUMENTS

2005/0040468 A1* 2/2005 Minami .......... H01L 21/823871
257/369
2009/0085030 A1* 4/2009 Peters .............. H01L 21/28518
257/48

OTHER PUBLICATIONS

Extended European Search Report for EP Application No. 18178062. 8, Nov. 29, 2018.

* cited by examiner

DeepNwell, Pwell, Fieldoxide, polysilicon, Source/drain diffusions

*Skip poly sidewall protection*

Silicide + HDP oxide

LPCVD passivation (Noble) Bondpad metalisation

FIG. 13

CMOS BASED DEVICES FOR HARSH MEDIA

FIELD OF THE INVENTION

The present invention relates to semiconductor devices which can be deployed in harsh media. More specifically it relates to harsh media sensors comprising a passivation layer and to methods comprising such a sensor.

BACKGROUND OF THE INVENTION

FIG. 1 shows a standard connection between polysilicon 14 and mono-silicon 11 realized in a CMOS process. A well doping 10 may be present in the mono-silicon 11. Polysilicon 14 is deposited and patterned on top of a field oxide 13. The flanks of the polysilicon 14 are covered with an insulator with a side wall passivation 15 such as oxide or nitride. The mono-silicon 11 that is not covered with field oxide and the polysilicon 14 are implanted simultaneously. Then diffusion takes place to form the source and drain contacts 12. Then a metal is deposited and during an annealing step it is dissolved into the mono-silicon and the polysilicon to form a silicide 16. The metal that is not dissolved is etched away whereas the silicide 16 remains. Obtaining a first metal conductor layer 18 connected with the mono-silicon 11 and/or polysilicon 14 is achieved by deposition of a first High Density Plasma (HDP) oxide 19 followed by etching contact holes in the first HDP oxide 19 to provide access to the silicide of the poly-14 and simultaneously other holes to provide access to the silicide of the mono-silicon 11. The contact holes are filled with a metal plug 17 and a connection between the different plugs is made with the first metal conductor 18 deposition. Patterning of this first metal 18 defines which contacts are connected and which contacts are not. Then the process of another metal layer process can be applied starting with the deposition of a second HDP oxide 20. As a result, the mono-silicon 11 is electrically connected to structures of polysilicon 14 by metal line 18 on top of metal contact plugs 17. In general copper or aluminium is used to form this first metal conductor 18.

The electrical connection between the polysilicon shield 14 and mono-silicon contact 12 shown in FIG. 1 is not suitable for pressure sensors that operate in harsh environments.

In FIG. 1 a second HDP oxide 20 is deposited over the first metal 18 and over the first HPD oxide 19 and a PECVD nitride 21 is present on top of the device.

Instead of through a first metal layer, in principle one can create a mono-11 polysilicon 14 contact by sintering an edge 22 of polysilicon 11 that is defined on mono-silicon 14. The left of FIG. 2 shows a cross section of such a contact. During patterning of the polysilicon 14 the gate oxide next to the edge of the polysilicon in the areas without field oxide is also removed. After the drain/source 12 implant and diffusion the sputtering of the metal for the silicide 16 is carried out, it then also covers the edges of the polysilicon. During the anneal step the metal diffuses into the silicon and the silicon diffuses into the metal. As a result, the silicide 16 grows at the silicon surface and therefore the silicide 16 grown on the mono-silicon 12 will connect to the silicide 16 grown at the edges of the polysilicon 14 and bridge the thin gate oxide 23, thereby making an edge contact 22. To assure that such a contact between mono- and polysilicon is not made between the gate and the source/drain diffusions of CMOS transistors a side wall passivation 15 is normally defined at the edges of the polysilicon 14 as described in U.S. Pat. No. 4,622,735.

Normally no lithography is carried out for this side wall passivation 23. In this example the processing of the sidewall passivation 23 has to be skipped to make mono-polysilicon contacts or must be locally etched away when shielded piezoresistors are integrated together with CMOS transistors. The creation of mono-polysilicon contacts by creating a silicide on the edges of the polysilicon is therefore a non-standard way of CMOS processing. Sputtering at side walls is normally not required for CMOS processing and therefore special control is needed to assure mechanical and electrical connection at the edges of the polysilicon. Standard CMOS processes might need modifications to assure proper mono-polysilicon contacts. Dedicated Process Control Modules must be developed to monitor the quality of the mono-polysilicon contact during mass production.

If it is not possible to use aluminum of copper interconnects, alternative prior art solutions lead to an increase of the resistance of the connection lines. This is illustrated in the table below shows the resistance of different kinds of interconnect. A top metal layer of 1 μm aluminium is very common for CMOS processing (e.g. metal 18 in FIG. 1) and can be used as a bench mark for resistivity. The table shows that sheet resistance of doped silicon with a silicide has a sheet resistivity that is two orders of magnitude higher than that of aluminium:

| | | |
|---|---|---|
| $R_{sheet}$ 1 μm Al | 0.03 | Ohm/sq |
| $R_{sheet}$ 0.2 μm Pt | 0.85 | Ohm/sq |
| $R_{sheet}$ silicided silicon | 3.0 | Ohm/sq |

For harsh media often a 0.2 um thick platinum layer is used with the compromise between thickness (cost) and resistivity resulting in a resistivity that is more than an order of magnitude higher than that of 1 μm aluminium.

In view of this combination of a good conductivity of the interconnects and a reliable operation in harsh media, there is therefore still room for improvement in semiconductor devices which need to be robust against harsh media and in methods for producing these semiconductor devices.

SUMMARY OF THE INVENTION

It is an object of embodiments of the present invention to provide a semiconductor device which provides reliability in harsh media and to provide a method for producing such a semiconductor device.

The above objective is accomplished by a method and device according to the present invention.

In a first aspect embodiments of the present invention relate to a semiconductor device. This semiconductor device comprises a first doped semiconductor layer, a second doped semiconductor layer, an oxide layer covering the first doped semiconductor layer and the second doped semiconductor layer.

The semiconductor device moreover comprises an interconnect. A first part of the interconnect is electrically connected with the first doped semiconductor layer and a second part of the interconnect is electrically connected with the second doped semiconductor layer. A part of the interconnect between the first side end the second side crosses over a sidewall of the second doped semiconductor layer. The interconnect comprises a metal filled slit in the oxide layer. In embodiments of the present invention this metal filled slit electrically connects the first doped semiconductor layer with the second doped semiconductor layer.

At least one electronic component is formed in the first and/or second semiconductor layer.

The semiconductor device moreover comprises a passivation layer which covers the first and second doped semiconductor layers and the oxide layer.

It is an advantage of embodiments of the present invention that the passivation layer provides reliability of the semiconductor device (e.g. sensor) in harsh media. It is an advantage of embodiments of the present invention that all conductive paths are present under the passivation layer as this allows to avoid leakage currents between the connection paths, especially when the semiconductor device is exposed to moisture.

It is an advantage of embodiments of the present invention that contacts between the first and second doped semiconductor layer is realized through metal filled slits and that no metal stack is required for providing the interconnections.

It is an advantage that a semiconductor device in accordance with embodiments of the present invention can be produced using standard CMOS production facilities.

In embodiments of the present invention the bondpad is made of a noble metal.

In embodiments of the present invention the semiconductor device comprises a well of a second conductivity type in a deep well of a first conductivity type or in a substrate of the first conductivity type opposite to the second conductivity type. In that case the deep well or substrate of the first conductivity type are corresponding with the first doped semiconductor layer.

At least one of the electronic components is present in the well of the second conductivity type.

The second semiconductor layer is present between the passivation layer and the electronic component. and the oxide layer is present over the second semiconductor layer, over the well and over the deep well or substrate of the first conductivity type.

In embodiments of the present invention the semiconductor device comprises at least one conductive path connected between the at least one electronic component and at least one via which is connected through the passivation layer with a bondpad.

It is an advantage of embodiments of the present invention that, by providing a conductive path between the at least one via and the electronic component, it is possible to put the via and the electronic component at a certain distance from each other.

In embodiments of the present invention the semiconductor device comprising a field oxide wherein the field oxide is present between the second doped semiconductor layer and the first doped semiconductor layer.

If a well is present in the first doped semiconductor layer, the field oxide may be present between the second doped semiconductor layer and the well.

In embodiments of the present invention the field oxide provides a spacer between the electronic components and the polysilicon on top of the electronic component serving as shield and prevents this polysilicon shield from modulating the lowly doped region under the shield. In embodiments of the present invention the areas under the field oxide have a lower doping than the areas where no field oxide is grown. In embodiments of the present invention these low doped areas are used as electronic component (e.g. piezo resistor). It is an advantage of embodiments of the present invention that the electrical insulation between the well and the polysilicon shield is provided by the field oxide.

In embodiments of the present invention the second semiconductor layer may be present under the bondpad.

In embodiments of the present invention the passivation has a stoichiometric structure of $Si_3N_4$ or diamond like carbon or diamond or SiC or $Al_2O_3$.

It is an advantage of embodiments of the present invention that the chemical and mechanical robustness is increased by providing a passivation which has a stoichiometric structure.

In embodiments of the present invention the second doped semiconductor layer and/or the first doped semiconductor layer is at least partially covered with a metal alloy.

The second doped semiconductor layer may for example be a polysilicon shield and the metal alloy may for example be a silicide. To avoid CTE mismatch it is better not to have metal alloy above the electronic component (e.g. sensing element). Therefore, the metal alloy is sometimes only partially covering the second doped semiconductor layer.

The advantage of the metal alloy is that it may result in an improved contact (lower resistivity) between the second and the first doped semiconductor layer.

In embodiments of the present invention the at least one electronic component is a piezo resistor. These semiconductor devices may be configured such that they can be used as a pressure sensor.

In embodiments of the present invention the at least one conductive path comprises a highly doped path of the second conductivity type in the well.

In embodiments of the present invention the at least one conductive path comprises a polysilicon layer between the electronic component and the at least one via.

In embodiments of the present invention the polysilicon layer which is part of the conductive path is patterned.

It is an advantage of embodiments of the present invention that the conductivity is increased by patterning the polysilicon layer. In embodiments of the present invention patterning results in an increased surface of the polysilicon structures perpendicular to the direction of the current. In embodiments of the present invention wherein the polysilicon structure is covered with silicide this results in an increased amount of silicide in the direction of the current and therefore the line conductivity can be at least two times higher than for a flat polysilicon structure.

In embodiments of the present invention the at least one conductive path comprises metal filled slits parallel to a direction of a current when the current is flowing in the conductive path.

In embodiments of the present invention the metal filled slit is electrically connected with the first doped semiconductor layer through a highly doped contact.

In embodiments of the present invention where the first doped semiconductor layer is a deep well of the first conductivity type, the highly doped contact may also be of the first conductivity type.

In embodiments of the present invention the at least one conductive path comprises structured polycrystalline semiconductor material (e.g. silicon) which may be covered with a metal alloy. Structured polycrystalline semiconductor material is partially turned into a metal alloy. Thereby metal is diffused in the polycrystalline material such that the remaining part is covered with a metal alloy.

In embodiments of the present invention the metal alloy is added after the deposition of the second semiconductor layer (e.g. the polysilicon) and before the deposition of the oxide layer. The metal alloy may for example be a silicide.

It is an advantage of embodiments of the present invention that the conductivity of the conductive path is increased even more by providing the metal alloy on top of the silicon which is part of the path.

In a second aspect embodiments of the present invention relate to a method for manufacturing a semiconductor device. The method comprises:

providing a first doped semiconductor layer and providing a second doped semiconductor layer, wherein the first and the second doped semiconductor layer are provided such that at least one electronic component is formed in the first and/or second semiconductor layer, depositing an oxide layer over the second doped semiconductor layer and over the first doped semiconductor layer, removing part of the oxide layer to obtain a slit in the oxide layer over the first doped semiconductor layer, over a sidewall of the second doped semiconductor layer and over the second doped semiconductor layer, filling the slit with a metal thereby creating an electrical interconnect between the first doped semiconductor layer and the second doped semiconductor layer, providing a passivation layer over the first and second doped semiconductor layers and over the oxide layer.

It is an advantage of embodiments of the present invention that the contact between the first doped semiconductor layer (e.g. the deep well) and the second doped semiconductor layer (e.g. the polysilicon shield) is manufactured by making a metal filled slit as this allows to apply the passivation layer at high temperature. By increasing the temperature, the amount of dislocations and voids can be reduced and a crystalline structure can be obtained. Crystalline structures have the advantage that they etch slower and therefore are more robust against harsh environments than amorphous material with the same combination of atoms. In embodiments of the present invention the passivation layer is applied using low pressure chemical vapor deposition.

In embodiments of the present invention the first doped semiconductor layer is a deep well of a first conductivity type or a substrate of the first conductivity type. An electronic component may be present in a well in the deep well or in the substrate.

In embodiments of the present invention the second doped semiconductor layer is a polysilicon shield. This shield may be provided over the electronic component without sidewall protection at its edges. A silicide is then formed between the edges of the polysilicon shield and the substrate in areas where no field oxide is present at the edge of the polysilicon.

In embodiments of the present invention the method moreover comprises:

providing at least one conductive path starting from the at least one electronic component, providing at least one via through the passivation layer such that the via is connected with the conductive path and with a bondpad on the via.

In embodiments of the present invention the conductive path is created by at least one metal filled slit.

In embodiments of the present invention the metal filled slit is created on top of the second doped semiconductor layer. It may for example be created in a slit of an oxide on top of the second doped semiconductor layer.

In embodiments of the present invention the conductive path is a doped conductive path of the second type and forms a diode with the deep well of the first type. In that case capacitance and leakage currents are proportional to the surface of the conductive path. A compromise can be made between leakage currents and capacitance by defining the conductive path with metal filled slits on top of the field oxide. The conductance is then reduced as no conduction takes place in silicide below the metal filled slits. However, the capacitance and leakage currents are only generated in the sensing element.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

BRIEF DESCRIPTION OF THE DRAWINGS

FIGS. 12 to 13 show method steps of a method in accordance with embodiments of the present invention.

Figure 1:
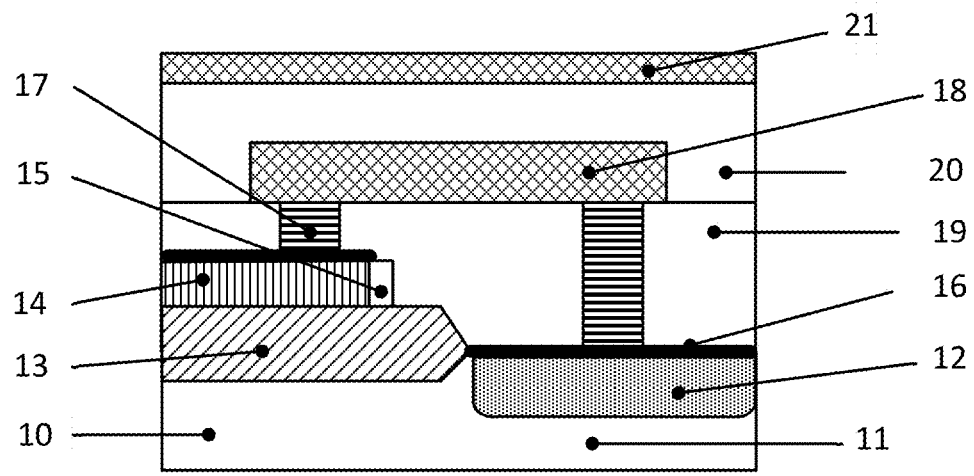
FIG. 1 shows a standard connection between polysilicon and mono-silicon realized in a CMOS process.
Figure 2:
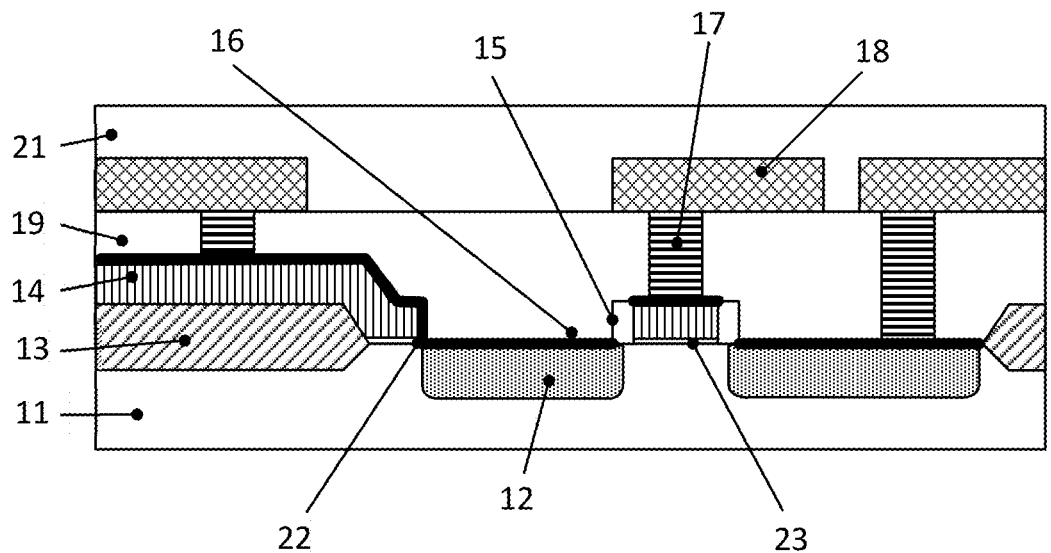
FIG. 2 shows a prior art silicide contact between polysilicon and monosilicon.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

In a first aspect embodiments of the present invention relate to a semiconductor device 100 which comprises a first doped semiconductor layer 112, a second doped semiconductor layer 122, an oxide layer 127 covering the first doped semiconductor layer 112 and the second doped semiconductor layer 122, and an interconnect 129.

The first doped semiconductor layer 112 is electrically connected with the second doped semiconductor layer 122 by means of the interconnect 129 which comprises a metal filled slit 123 in the oxide layer 127. The second doped semiconductor layer 122 partially overlaps the first doped semiconductor layer 112. A first part of the interconnect 129 is in contact with the first doped semiconductor layer 112. A second part of the interconnect is in contact with the second doped semiconductor layer 122. A part of the interconnect between the first side and the second side crosses a sidewall 133 of the second doped semiconductor layer. The interconnect may have a plurality (e.g. alternating) of contacts with the first semiconductor layer and the second semiconductor layer. A sidewall passivation 132 may be present on the sidewall 133.

In embodiments of the present invention at least one electronic component 115 is formed in the first and/or second semiconductor layer 112, 122.

The semiconductor device moreover comprises a passivation layer 128 which covers the first and second doped semiconductor layers 112, 122 and the oxide layer 127.

The length of the slit is so long that a metal which fills the slit is in contact with the second doped semiconductor layer 122 and with the first doped semiconductor layer 112 and this even if a side wall passivation 132 is present at the edge 133 of the polysilicon.

The metal in the metal filled slit can for example comprise Tungsten. This allows to apply a passivation layer at higher temperatures than conventional PECVD passivation layers without damaging the interconnection in contrast to for example cupper or aluminum interconnects.

In embodiments of the present invention the first semiconductor layer and the second semiconductor layer may be silicon layers. The first or second semiconductor layer can for example be a poly- or a mono-silicon layer.

In embodiments of the present invention the semiconductor device 100 comprises a well 114 of a second conductivity type (e.g. p-type) in a deep well or substrate 112 of a first conductivity type (e.g. n-type) opposite to the second conductivity type. The deep well or the substrate of the first conductivity type are thereby corresponding with the first doped semiconductor layer. Reference is made to a deep well 112 to make the distinction between the well 114 and the deep well 112 which is deeper than the well 114.

In this example at least one electronic component 115 in the well 114, and the second doped semiconductor layer 122 (this may for example be a polysilicon shield 122) is present between the passivation layer 128 and the electronic component 115.

In this example the oxide layer 127 is present over the second semiconductor layer 122, over the well 114, over the deep well 112 of the first conductivity type or substrate of the first conductivity type. The deep well 112 of the first conductivity type or the substrate of the first conductivity type are thereby corresponding with the first doped semiconductor layer 112. The deep well 112 may for example be a doped mono-silicon layer.

For CMOS circuits an n-type deep well 112 is created in a p-substrate 110 to have electrical isolation between different deep n-wells 112 which avoids cross-talk between sub-circuits. One can leave out deep n-wells 112, but then one must use n-type substrates 110 instead of p-type substrates and then the bulk of the device has to be connected to the highest voltage. Normally the bulk of CMOS is p-type and electrically connected to ground. Discrete pressure sensors without CMOS circuitry normally are made of n-type substrates.

The electrical connection 123 between the first and second doped semiconductor layers (e.g. mono- and polysilicon) is covered with the passivation layer 128 which provides reliability in harsh media. In embodiments of the present invention the passivation layer is a stoichiometric passivation layer such as $Si_3N_4$, DLC, diamond, SiC or $Al_2O_3$ to achieve maximum chemical and mechanical robustness. The stoichiometric passivation layer is formed at temperatures higher than 600 or even 800° C. and therefore is not compatible with metals such as platinum, aluminium and copper which are normally used for standard CMOS processing. At such temperatures aluminium melts and copper diffuses to the silicon and destroys the semiconductor properties of the silicon. Furthermore, in case of a copper metal conductor 18 the construction shown in FIG. 1 would crack due to the high thermal expansion and high stiffness of the copper. One could use silicon with silicide as interconnect, but that has the disadvantage that a lot of resistance is added to the piezo resistors which will lower the sensitivity and add offset if the interconnect is not matched for all resistors. For interconnect with a sheet resistance of 3 ohm/sq with a width of 20 µm and a length of 1 mm 150 Ohm is added to the piezo resistor. For piezo resistors with a typical value of 4.5 kOhm this will decrease the sensitivity with more than 3%.

In embodiments of the present invention, on the other hand, a stoichiometric passivation layer can be applied because the interconnect 123 between the poly- and the mono-silicon is a metal filled slit in the oxide layer. The metal plug should be a high temperature resistant metal plug. The metal may for example be tungsten. Tungsten has a very small expansion coefficient (5 ppm/° C.) and will therefore not crack the oxide providing the slits. Another advantage is that tungsten does not react to the atmosphere of silane and ammonia during the LPCVD deposition of nitride. Ti or TiW do react and have a large thermal expansion coefficient (7-9 ppm/° C.) Other metals used in standard CMOS could be nickel, but that will cause cracks due to the large CTE (>13 ppm/° C.)

By making metal filled slits instead of holes in the oxide layer, the metal filled slits form the interconnect between the mono- and the polysilicon, and the metal stack is not required. The absence of the metal stack (comprising aluminium or copper) allows to deposit a passivation layer at high temperatures allowing to grow a passivation layer with a stoichiometric structure. Also, the conductive paths between the at least one electronic component and the at least one bondpad may be realized by metal filled slits in the oxide layer. The bondpads are typically at the edge of the die so that the slits cover a certain distance between the electrical component or piezo-resistor to the via towards the bondpad. Preferably the vias are made under the bondpad far away from the piezo-resistor.

By making slits instead of holes, any sidewall passivation at the edges of the polysilicon shield does not need to be removed to enable a contact between the polysilicon shield and the mono-silicon. This is compatible with processes which require sidewall passivation for creating CMOS transistors.

The ohmic contact between the polysilicon and the monosilicon cannot be achieved by simply growing the polysilicon on top of monosilicon with standard techniques such as LPCVD used for CMOS processing as this would result in oxidation of the monosilicon during the loading of the wafers with exposed monosilicon into the deposition tool. It is also an advantage that no silicide is created on the silicon before deposition of the polysilicon as the sputtering process of the metal used to make the silicide would deteriorate the oxide for the gates of CMOS transistors or even etch the oxide away completely.

In embodiments of the present invention the first conductivity type is n-type and the second conductivity type is p-type. In embodiments of the present invention the at least one electronic component is a piezo-resistor.

In embodiments of the present invention the polysilicon shield 122 above the electronic component 115 comprises a dopant of the first conductivity type.

Figure 3:
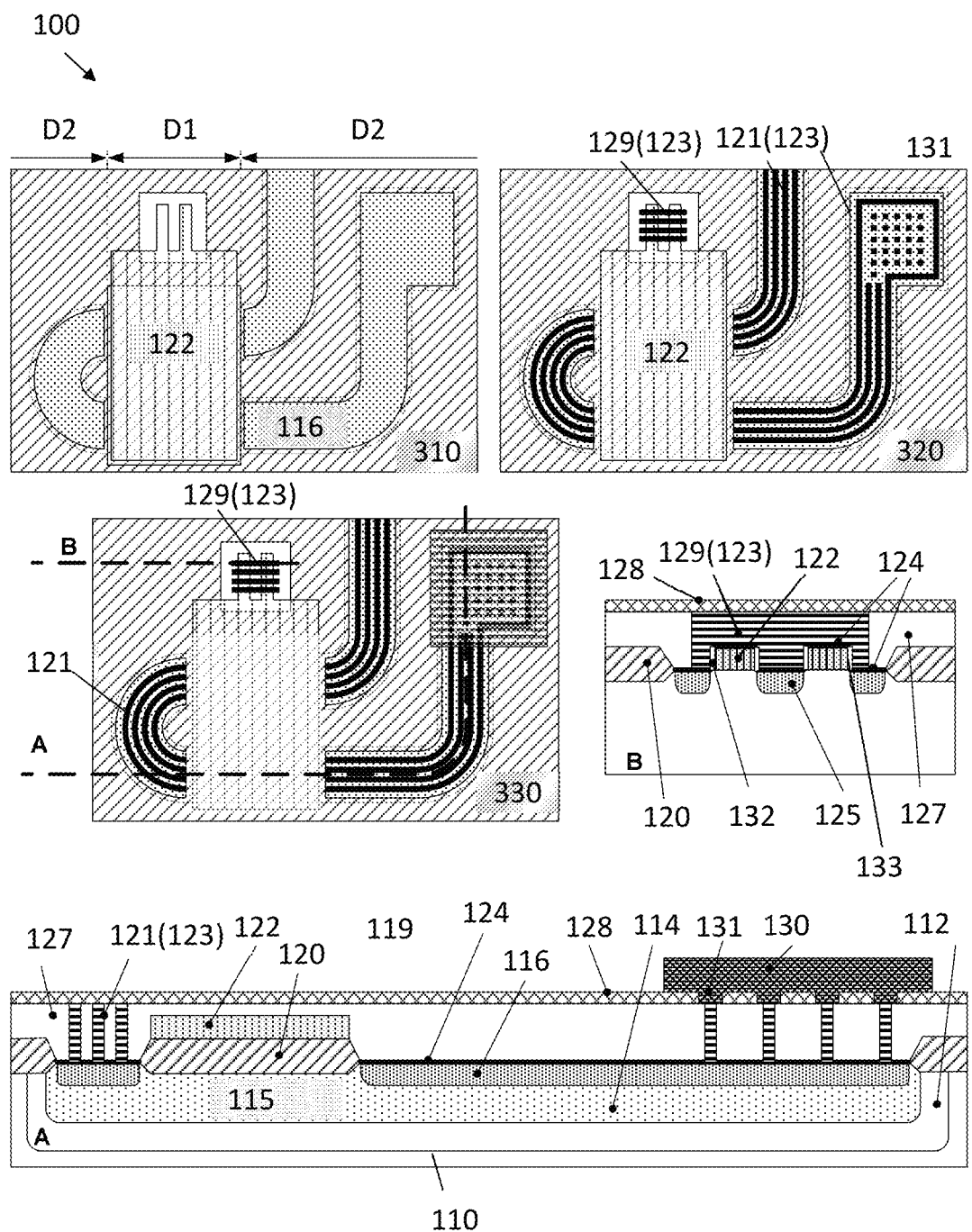
FIG. 3 shows layout features of a semiconductor device in accordance with an exemplary embodiment of the present invention.

FIG. 3 shows layout features of a semiconductor device in accordance with an exemplary embodiment of the present invention.

The top left schematic drawing 310 shows an intermediate process stack wherein the polysilicon shield 122 and a contact well 116 are shown. In this stack no silicide is present on the polysilicon shield 122 above the electronic components. In embodiments of the present invention the polysilicon shield may be doped to assure enough conductivity for shielding the electronic components. Not adding the silicide to the polysilicon shield may be advantageous because silicide might introduce a CTE (coefficient of thermal expansion) mismatch between the polysilicon shield and the areas of the electronic components beneath. In embodiments of the present invention silicide is present on the contact area (e.g. on the poly-silicon where contact is made to the metal slit) for a proper electrical contact to the substrate. The silicide is preferably not present above the electronic components in order to avoid unwanted stress in the poly-silicon above the electronic component (e.g. piezo-resistive areas).

In this example all polysilicon is removed from the interconnection paths and the bondpad areas. The polysilicon is not required because metal filled slits are used for the interconnect.

The schematic drawing 320 shows the interconnects 129 which are comprising metal filled slits 123 that provide the substrate contact for the polysilicon shield. The schematic drawing also shows the conductive paths 121 for the electronic components 115 (e.g. piezoresistors). In this example the conductive paths 121 are comprising metal filled slits 123.

The schematic drawing 330 shows the bondpad area on the top right where the dark square indicates the bondpad metal 130 on top of a stoichiometric passivation layer 128. Holes etched in this passivation layer (not shown) provide the electrical connection from the noble top metal to the metal filled slits under this passivation layer.

Cross section A shows from left to right a conductive path 121 with metal filled slits 123 on a substrate contact 116 of the second conductivity type (e.g. p-type source/drain diffusion), an electronic component 115 (e.g. piezo-resistor) defined by a well diffusion 114 of the second conductivity type and isolated from the polysilicon shield 122 with the field oxide 120 (the polysilicon shield 122, the field oxide 120 and the electronic component are together forming a shielded electronic component). Further to the right a conductive path 121 (comprising the silicide 124) between the electronic component 115 and the bondpad 130 is shown. For the bondpad a noble top metal 130 is deposited on top of the stoichiometric passivation 128 and connected to the metal filled slits 123 through vias 131 in that passivation. Preferably the vias are made under the bondpad away from the electronic component.

Cross section B shows the cross section of an interconnect comprising a metal filled slit 123 that is placed perpendicularly across an array of polysilicon structures 122 and providing an electrical contact between the mono-112 and polysilicon 122 although the polysilicon side walls 133 are isolated by a polysilicon sidewall passivation 132. The polysilicon structures 122 as well as the deep well 112 comprise dopants of the first conductivity type. The metal filled slit 123 connects deep well contacts 125, which are doped with a dopant of the first conductivity type (e.g. n++ contacts), with the polysilicon shield 122. The metal filled slit crosses the sidewall 133 of the second semiconductor layer 122. It may be in contact with the sidewall 133. In the example a sidewall passivation is present in between the sidewall and the metal filled slit.

The field oxide 120 may for example have a thickness of 450+/−200 nm. The polysilicon 122 may for example have a thickness of 400 nm+/−150 nm and the HDP oxide 127 may for example have a thickness of 800 nm+/−400 nm.

It is an advantage of embodiments of the present invention that electronic components (e.g. a piezoresistor) can be created which are connected to the substrate and interconnect under a stoichiometric passivation layer. Thus, a semiconductor device can be created which is protected against a harsh environment. It is an advantage of embodiments of the present invention that the interconnect has a resistance which is not significantly higher than that of a conventional interconnect. The semiconductor device may for example be a sensor. An increase in the resistance of the interconnect will result in a reduction of the sensitivity of the sensor.

It is an advantage of embodiments of the present invention that it is not required to remove the side wall passivation of the polysilicon for making the interconnect between the polysilicon and the mono-silicon. As removing the side wall passivation is not required, co-integration with CMOS transistors is possible.

In embodiments of the present invention highly conductive paths 121 connect the at least one electronic component 115 with at least one bondpad 130 on top of the passivation. This connection between a conductive path 121 and a bondpad may be achieved by means of a via 131 through the passivation layer 128. In embodiments of the present invention the bondpads are made of noble metal.

It is an advantage of embodiments of the present invention that such a stack can be realized using a process flow which comprises standard CMOS processing steps. Therefore, most of this flow can be executed in any CMOS wafer-fab up to deposition of the passivation layer when a stoichiometric passivation layer is applied.

Standard CMOS provides (low) doped areas 115 under a field oxide 120 and (higher) doped areas 116 where no field oxide is grown. The surface of these latter areas can be turned into a silicide 124. In embodiments of the present invention the (low) doped areas 115 under the field oxide 120 are used as electrical component 115 (e.g. piezo resistor).

In embodiments of the present invention the second conductivity type is p-type. The p-well areas 115 or piezoresistors can be electrically isolated from each other by using an n-type wafer. However, CMOS is normally realized in p-type silicon. Therefore prior to the p-wells a so called deep n-well diffusion may be defined to provide the electrical isolation between the piezo-resistors 115. Another way to isolate the resistors from each other is by using an SOI wafer with oxide filled trenches around the resistors that reach down to the buried oxide. One could define this deep n-well diffusion for the entire wafer without using photolithography of the implantation. In embodiments of the preset invention the lowly doped well 114 is made more conductive by adding source drain diffusion 116 with silicide and is used as conductive path 121 between the at least one electronic component 115 and the vias 131. In CMOS this diffusion 116 is in general referred to as the source/drain areas. The lowly doped well 114 may for example be a p-well 114 with a sheet resistance between 2000-5000 ohm/sq, by adding the implant 116 a sheet resistance of 100-150 ohm/# without silicide and 3 ohm/# with silicide may be achieved.

It is an advantage of embodiments of the present invention that the polysilicon shields 122 can be made using the same process as the gates of CMOS transistors.

In embodiments of the present invention the field oxide 120 provides a spacer between the electronic component 115 and the and the polysilicon shield. This spacer prevents the shields from modulating the lowly doped region under the shield.

In embodiments of the present invention contacts holes 131 are etched in the passivation layer 128 so that bondpads 130 on top of the passivation layer 128 connect to the conductive path 121 under the passivation layer 128. Preferably the bondpads 130 are realized with a noble metal so that only the passivation layer 128 and the noble metal bondpads are exposed to the media above the sensor.

Applying the passivation layer and the noble metal may be done using dedicated equipment in a dedicated clean room to avoid contamination with CMOS.

Figure 4:
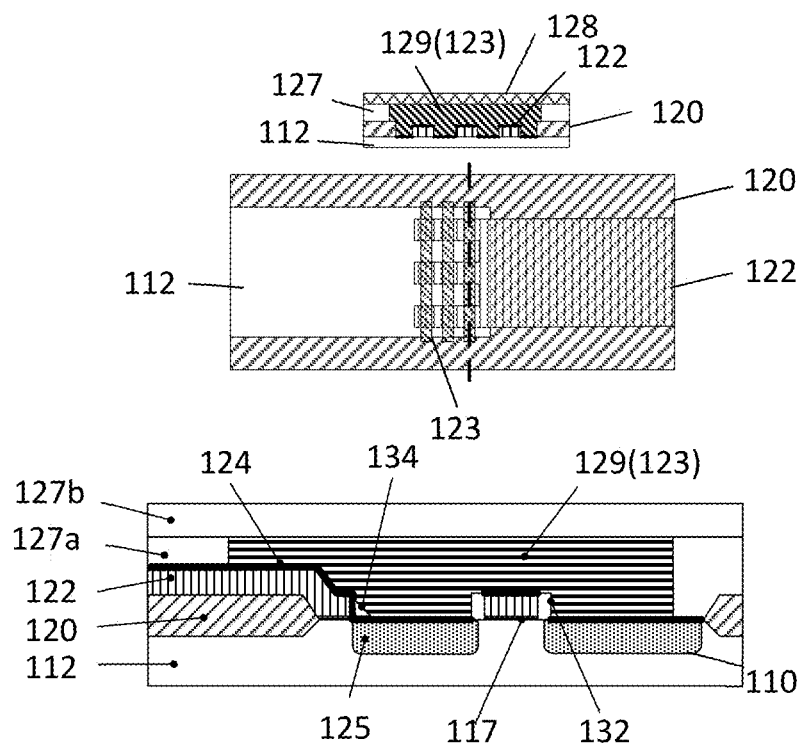
FIG. 4 schematically shows an exemplary embodiment of the present invention illustrating an implementation of the mono—polysilicon contacts.

FIG. 4 schematically shows an exemplary embodiment of the present invention illustrating an implementation of the mono 112—polysilicon 122 contacts. In FIG. 4 the interconnect 129 comprises a metal filled slit 123. The dimensions of the slit are such that the polysilicon shield 122 and the substrate 112 contact are interconnected using a metal plug.

The width of the slit is for example between 0.8 and 1.2 or even between 0.5 and 3 times the critical dimension (the critical dimension is the diameter of a CMOS contact plug). In embodiments of the present invention the width of the slit is about twice the thickness of the sputtered metal. The metal is not only deposited on the bottom of the slit, but also on the side walls. When the slit is too deep the deposition at the sides of the slit will close off the slit at the top before the bottom of the slit is filled. When the slit is too wide the slit will not be filled when the thickness of the metal is less than the depth of the slit. So, the width of the slit is optimized for a certain technology as function of depth of the slit and thickness of the sputtered layer. In embodiments of the present invention the depth of the slit may be larger than the width. The depth and the width are preferable selected such that the slit is filled with metal without a void at the bottom or a dip at the top.

The length of the slit may for example be between 1.5 and 3 or even between 3 and 10 times the critical dimension. The length of the slit may for example be at least 3 times, or even 10 times, or even 100 times, or even 5000 times longer than the width of the slit. The length of the metal filled slit is thereby measured from one outer end of the metal to the opposite outer end of the metal measured in the dimension which crosses the first and the second semiconductor layer.

The top of FIG. 4 shows how such slits 123 filled with metal can be used as contact between mono 112—and polysilicon 122. In this example the slits are defined perpendicular to the edges of the polysilicon. The bottom of FIG. 4 shows the details of some of the possibilities of such a slit 123. The well doping in FIG. 4 is of the first conductivity type (n-doped) and in the contact areas 125 the conductivity is enhanced by a source/drain implant of the first conductivity type which is also used to implant the polysilicon layer. A silicide 124 is formed simultaneously on the polysilicon 122 and the mono-silicon 125 after the diffusion of the implant. The figure shows that one slit filled with tungsten can connect mono- to polysilicon even when side wall passivation structures 132 or residues 134 are still present. This is possible because of the length of the slit.

In FIG. 4 the interconnect 129, between the mono- and poly-silicon is realized after structuring of the polysilicon 122 in a comb shape. Metal filled slits 123 are present orthogonal to the teeth of the comb and provide the contact between the polysilicon shield and the mono-silicon. Afterwards the interconnect and the polysilicon are covered with a passivation layer. This is preferably a stoichiometric passivation layer. FIG. 4 also shows a first HDP oxide 127a in which the metal filled slits are formed and a second HDP oxide 127b on top of the first HPD oxide and on top of the metal filled slits.

In embodiments of the present invention metal filled slits may be provided as low ohmic interconnection lines between the electronic components and the bondpads even without making a mono-polysilicon contact.

Figure 5:
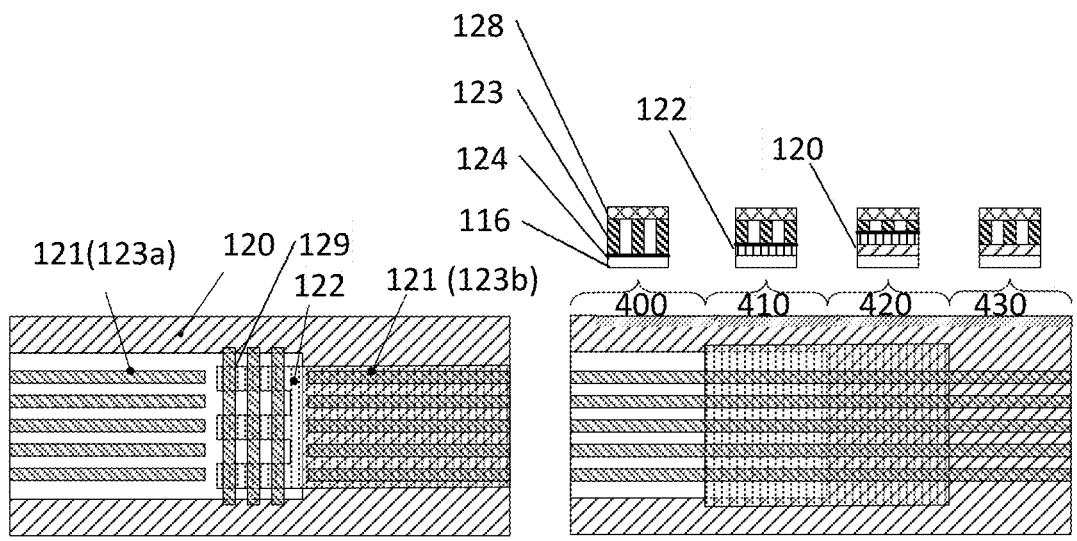
FIG. 5 shows metal filled slit interconnects as low ohmic interconnection lines, in accordance with embodiments of the present invention.

FIG. 5 shows metal (e.g. tungsten) filled slit interconnects 129 as low ohmic interconnection lines, in accordance with embodiments of the present invention. These interconnects 129 are shown in the middle of the left picture. On the left side of the left picture a conductive path 121 comprising metal filled slits 123a is shown which is defined in a path where no field oxide is grown. The width of such a path can for example range from 1 to 40 μm and it can be as long as the length of the die or even more.

In embodiments of the present invention the surface of the mono-silicon is doped with a source/drain implant to obtain a highly doped path 116 and covered with a silicide 124. An array of metal filled slits 123a is placed on top of the silicide 124 and these slits are realized over the entire length of the path aligned in the direction of the current. These metal filled slits are part of the conductive path 121 between the at least one electronic component and at least one bondpad 130. The conductive path 121 is electrically isolated from the rest of the chip by the source/drain diffusion 116 of the silicon. Therefore, this diffusion must have a doping that is opposite of the doping of the silicon around this diffusion. For a n-type mono-silicon deep well 112 the source drain doping must be p-type. The voltage of the substrate must be kept at a voltage that keeps the pn junction between the conduction path 121 and the bulk 112 in reverse bias so that isolation is obtained. One can also consider defining a p-type well over the length of the path which will increase the breakdown voltage between this line and the substrate, but also increase the capacitance between this conduction line and the bulk. Another effect is that small leakage currents will be present between these conductive paths 121 and the bulk in the order of 10 to 100 pA at room temperature. Such currents will not affect the behavior of a Wheatstone bridge with a resistance up to 100 KOhm (note that such leakage currents are always present for piezoresistors or other electrical components that make use of the well implant of the $2^{nd}$ type).

A similar conductive path 121 is shown at the right of the left picture where the metal filled slits are placed on the polysilicon shield 122 on a field oxide 120. The conductive path comprises metal filled slits 123b. A disadvantage of this conduction path is that the slits are less deep than the slits on the mono-silicon and therefore the resistance of such lines will be higher. However, the isolation of this line towards the bulk 112 is provided by the field oxide 120 and not by a pn junction. Therefore, the leakage current of such a conduction line towards the bulk can be totally neglected. The breakdown voltage is not improved as at the end of such a line always a contact to an electronic component 115 is made and this electronic component 115 in the well 114 always has a break down voltage.

The right picture of FIG. 5 shows the four different options that one has by defining metal filled slits as conductive paths in accordance with embodiments of the present invention. The left part 400 shows the metal filled slits placed on mono-silicon 116. This will result in the lowest resistivity of the path but will also increase somewhat the leakage current to the bulk. The part 410 shows a similar conductive path with polysilicon 122 between the metal filled slits 123 and the mono-silicon 116 resulting in a low ohmic connection between the mono-116 and polysilicon 122 at the left edge of the polysilicon 122. This line will have higher resistance than the array of metal filled slits on the mono-silicon 116, but it will show less leakage currents as a native oxide is present between the polysilicon 122 and the mono-silicon 116. The cross section 420 shows that the height of the metal filled slits 123 is minimal when polysilicon 122 is present between these slits and the field oxide 120. This will result in the least conductive path. However, the polysilicon serves as an etch stop for the list etching and makes this etching step less critical. The cross section 430 shows perfectly isolated conductive paths 121 on top of a field oxide 120. These paths will have less good conductivity than the paths in cross section 300 at the left, but without leakage currents and depletion capacitance. Therefore, this solution would be preferred for high temperature applications where leakage currents must be minimized.

The table below shows a comparison of resistances of conductive paths in accordance with embodiments of the present invention. The resistance of an array of polysilicon lines covered with a silicide with a width of 10 μm and a length of 1 mm will be about 1.5 ohm whereas a single line of tungsten with a length of 1 mm will result in a similar resistance of 1.32 ohm. However, an array of tungsten filled slits with a width of 10 μm and a length of 1 mm will be only 0.11 ohm, about 8 times less than a conventional platinum interconnect with a thickness of 0.2 μm and a width of 10 μm.

Figure 6:
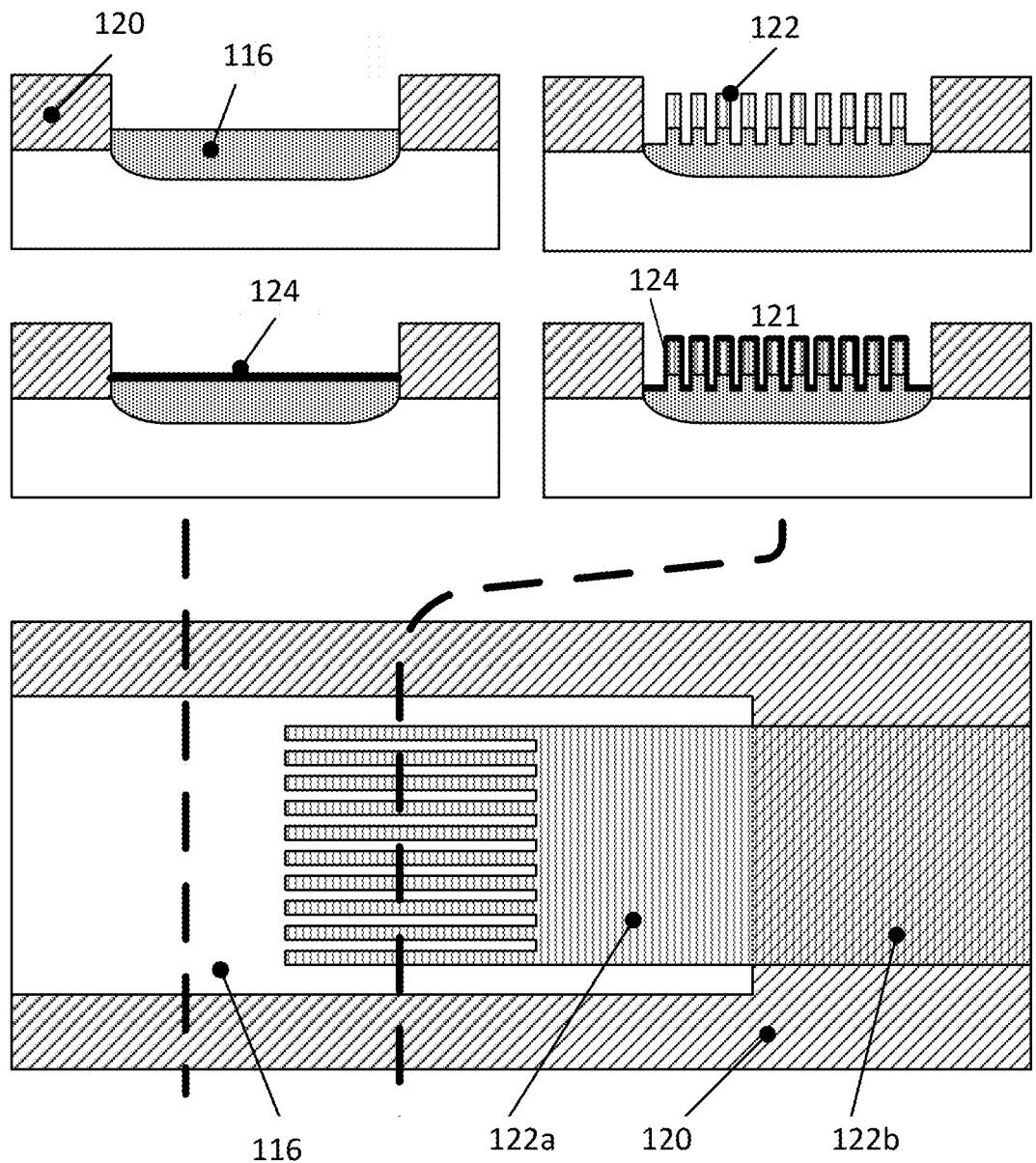
FIG. 6 and FIG. 7 show possible implementations of a conductive path in accordance with embodiments of the present invention.

| | | |
|---|---|---|
| R tungsten line (W: 0.4 μm, L: 10 μm) | 1.32 | Ohm |
| $R_{sheet}$ tungsten parallel lines a) | 0.11 | Ohm/sq |
| $R_{sheet}$ silicided polySi lines b) | 1.50 | Ohm/sq | a) 0.4 um wide, 1 um high tungsten lines at 0.8 um pitch
b) 0.4 um wide 0.4 um high poly lines at 0.8 um pitch FIG. 6 shows a possible implementation of a conductive path 121 in accordance with embodiments of the present invention. In this example lanes are defined by absence of field oxide 120 and an implant and silicide are provided on the mono-silicon 116 between the areas of field oxide 120. This is shown at the left of the top view in FIG. 6. The cross section shows that here the conductivity of the source/drain diffusion is enhanced by the silicide process which will result in a flat surface. The sheet resistivity of such a surface is about 3 ohm/square, 100 times higher the sheet resistance of a 1 μm thick aluminium layer.

In a preferred embodiment the conductive path 121 comprises thin lines of polysilicon 122 that are aligned with the direction of the current. The $2^{nd}$ cross section shows that in this way a lot of silicon surface is created perpendicular to the direction of the current. As a result more silicide 124 is available in the direction of the current and therefore the line conductivity can be at least two times higher than for the option at the right.

At the bottom of FIG. 6 a conductive path is shown which comprises at the far right a conductive line that consists of a polysilicon line 122b on top of the field oxide 120 that is doped and covered with silicide 124. This configuration has the advantage that electrical insulation to the substrate is provided by the field oxide and not by a pn junction. This will considerably reduce leakage currents of the device. Also, here polysilicon lines could be used, but then no conduction is present between the lines of polysilicon.

Right from the middle the least interesting option is indicated where non-patterned polysilicon 122a provides conduction in an area where the field oxide 120 is removed. With the same diffusion and silicide 124, polysilicon will always have a higher sheet resistance than mono-silicon.

Figure 7:
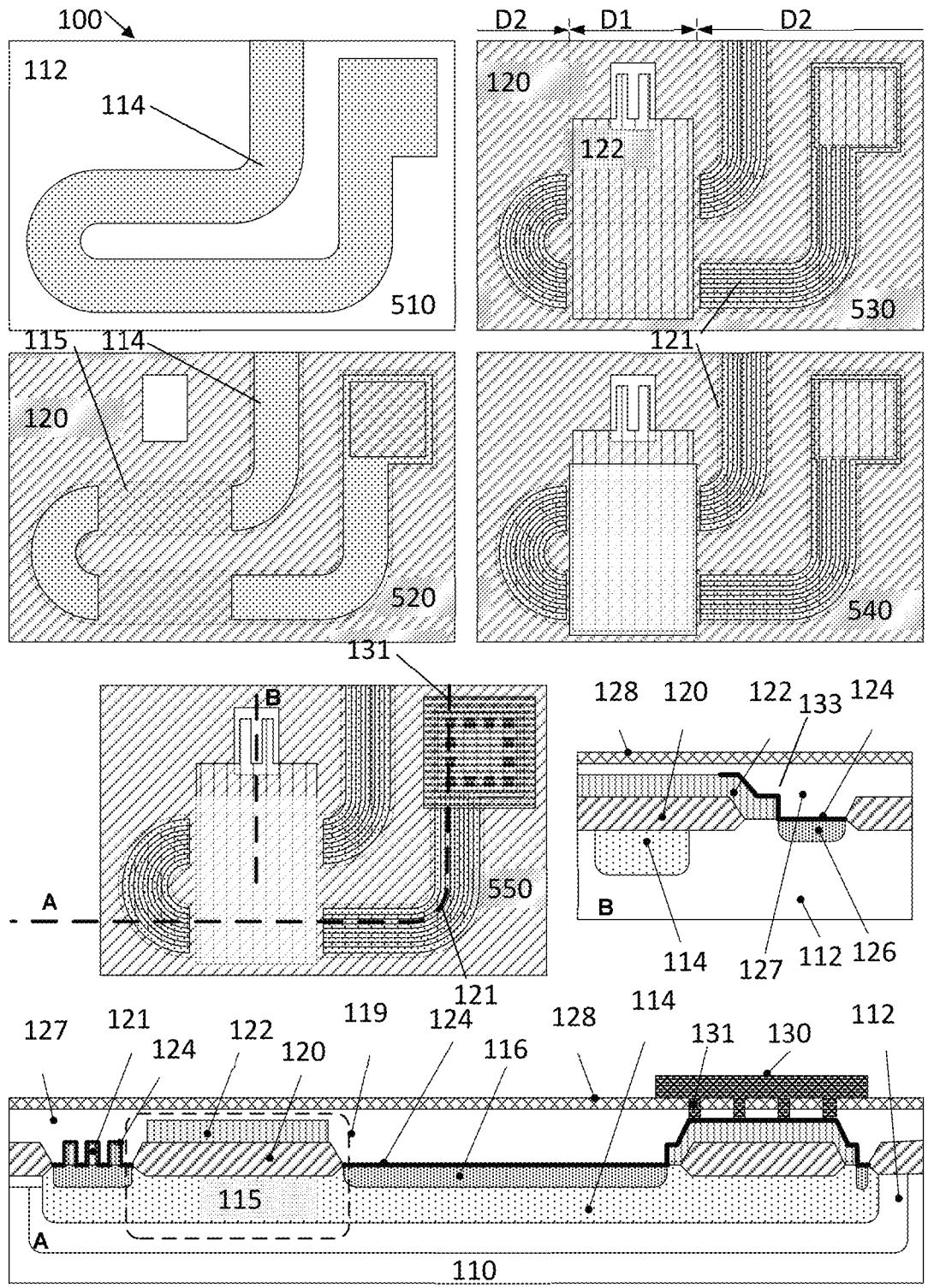

FIG. 7 shows an exemplary implementation of a conductive path 121 connected between the at least one electronic component 115 and at least one via 131 through the passivation layer 128 which is connected with a bondpad 130.

In this example area 510 shows the layout of a well 114 of the second conductivity type on a deep well 112 of the first conductivity type.

Area 520 shows the areas where a field oxide 120 is grown. It covers two rectangles each indicating an electronic component 115 (e.g. piezo resistors) at the bottom left of the area.

Area 530 shows where polysilicon is present as shield 122 and to enhance the conductivity in the paths defined by field oxide. The shield 122 and its contact to the substrate are of the first conductivity type (e.g. n-doped) whereas the bondpads and the conductive paths are of the second conductivity type (e.g. p-doped).

Area 540 is similar to area 320 of FIG. 3 including the option to leave out the silicide on the shield above the piezo resistors.

Area 550 shows the contact holes 131 in the passivation layer 128 above the polysilicon in the bondpad area on the top right where the dark square indicates the bondpad metal.

Cross section A shows from left to right a conductive path 121 with polysilicon lines covered with silicide 124, an electronic component 115 (e.g. piezo-resistor) defined by a diffusion of the second conductivity type and isolated from the polysilicon shield 122 with the field oxide 120, a conductive path 121 comprising polysilicon lines covered with silicide between the electronic component 115 and the bondpad 130 where the depth of the vias through the passivation layer are minimised by the presence of the field oxide and the polysilicon.

Cross section B shows from left to right an electronic component 115 defined by a diffusion of the second conductivity type and isolated from a polysilicon shield 122 with the field oxide 120 and the connection to the bulk 112 with doping of the first conductivity type and a silicide 124. The polysilicon shield 122 does not have a silicide above the electronic components to assure optimal matching of expansion coefficients.

Figure 8A:
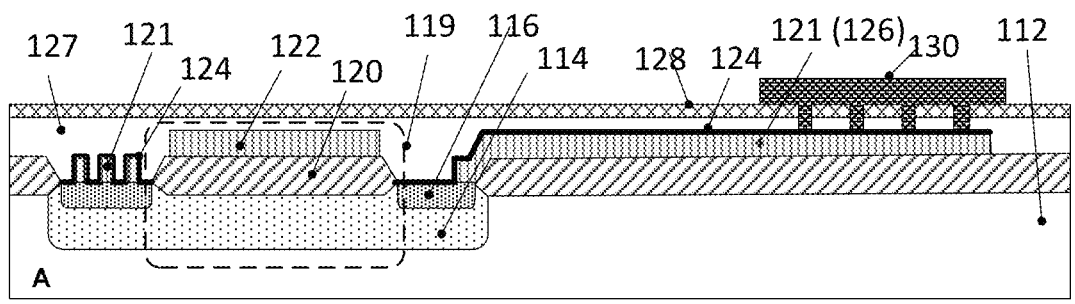
FIGS. 8a and 8b shows a conductive path comprising a polysilicon structure on top of a field oxide in accordance with embodiments of the present invention.

FIG. 8a shows a conductive path comprising a polysilicon structure 126 on top of a field oxide 120 in accordance with embodiments of the present invention. The polysilicon structure 126 is in contact with a p+ diffusion 116. A silicide 124 is covering the polysilicon structure 126 and the p+ diffusion 116. The polysilicon structure 126 is a p-doped polysilicon. Compared to the conductive path illustrated in FIG. 7 a lower leakage current and depletion capacitance can be obtained at the cost of an increased resistivity.

Figure 8B:
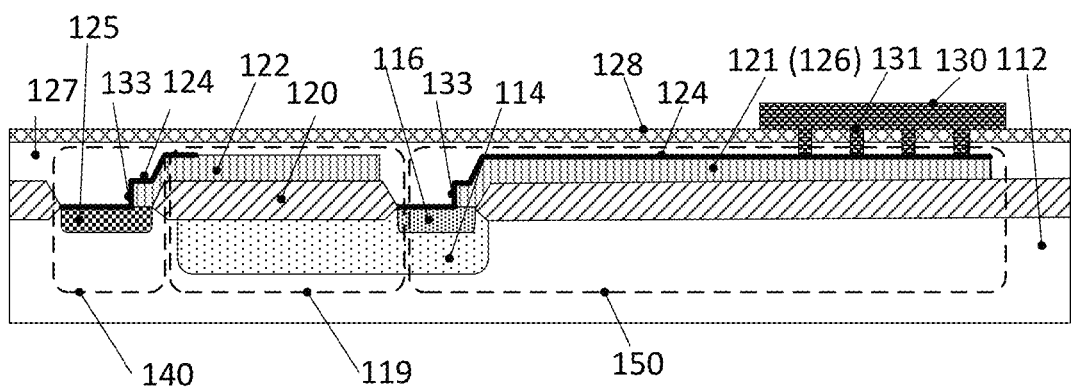
Figure 9A:
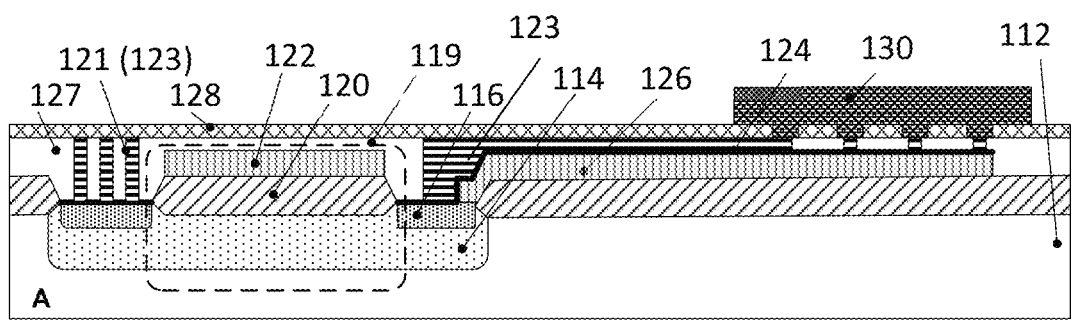
FIGS. 9a and 9b shows a conductive path comprising tungsten filled slits on top of a field oxide in accordance with embodiments of the present invention.

FIG. 8b shows the same configuration as FIG. 8a, but now with the connection 140 between the polysilicon shield 122 to a diffusion 125 of the $2^{nd}$ conductivity type in the bulk where 119 represents the sensing element and 150 the conductive path. FIG. 9a shows a conductive path comprising tungsten filled slits 123 on top of a field oxide 120 in accordance with embodiments of the present invention. The conductive path comprises a p-doped polysilicon structure 126 on top of the field oxide 120, a silicide 124 on top of the polysilicon structure and the tungsten filled slits 123 on top of the silicide. Compared to the conductive paths illustrated in FIG. 3 a lower leakage current and depletion capacitance can be obtained at the cost of an increased resistivity. It is, moreover, advantageous that the structure of FIG. 9a can be obtained using a more robust process.

Figure 9B:
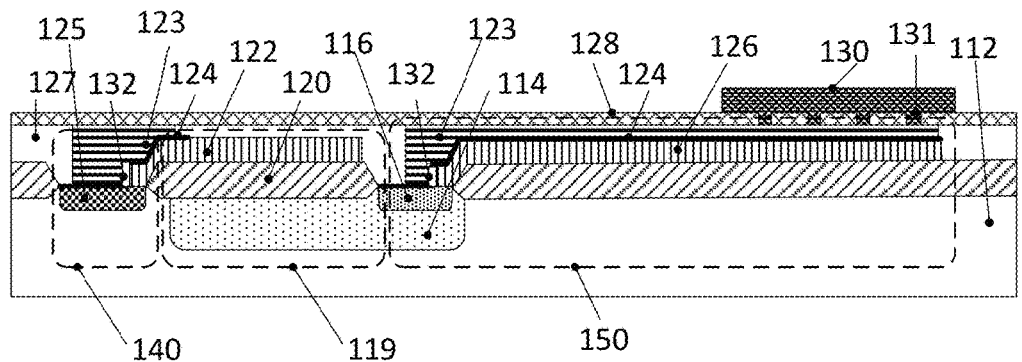

FIG. 9b shows the same configuration as FIG. 9a, but now with the connection 140 between the polysilicon shield 122 to a diffusion 125 of the $2^{nd}$ conductivity type in the bulk where 119 represents the sensing element and 150 the conductive path.

In the previous examples the electronic component was a piezo resistor. The invention is, however, not limited thereto and can be applied for different other electronic components. The invention may for example also be applied in the field of IR sensors to connect p-type polysilicon to n-type polysilicon on a thin membrane to make thermocouples.

Figure 10:
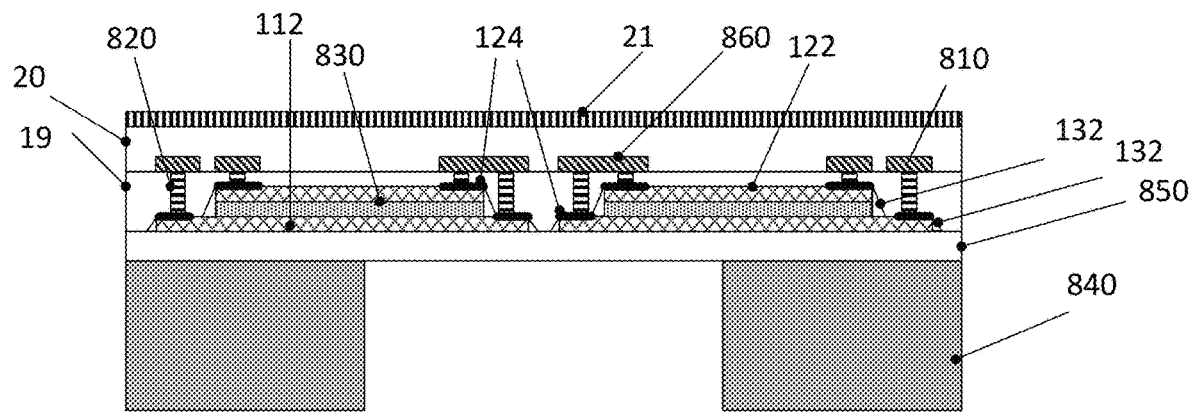
FIG. 10 shows a prior art thermocouple made for an IR sensor.

An example of such a prior art thermocouple device is illustrated in FIG. 10. It shows a silicon wafer 840 with an etched membrane. A field oxide 850 covers the silicon wafer. A first doped polysilicon layer 112 is covered with an oxide 830 grown on the first doped polysilicon layer 112 and a second doped polysilicon layer 122 is covering the first doped polysilicon layer 112. Metal contacts 810 are connected using tungsten plugs 820 with the first and second doped polysilicon layers. Aluminium bridges between the metal contacts provide the contact between the first and second polysilicon layers. These aluminium bridges cause stress, reflections and thermal leaks.

Figure 11:
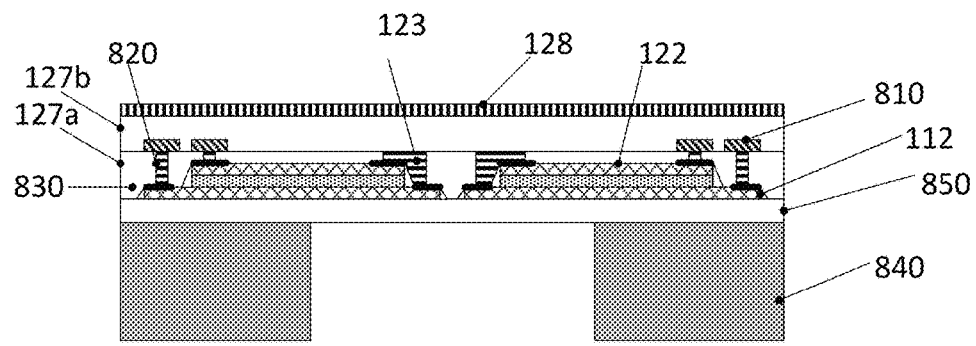
FIG. 11 shows a thermocouple for an IR sensor in accordance with embodiments of the present invention.

This is solved in the semiconductor device of FIG. 11 which shows a schematic drawing of a thermocouple device in accordance with embodiments of the present invention. In this example a first HPD oxide 127a is covering the first and second doped semiconductor layers (polysilicon). Metal filled slits 123 in the first High Density Plasma (HDP) oxide are interconnecting the first and second doped semiconductor layers 112 and 122. In this example a second HDP oxide 127b is covering the first HDP oxide. It is thereby an advantage of embodiments of the present invention that the absence of metal on the membrane prevents surface stress (cracks).

Figure 12:
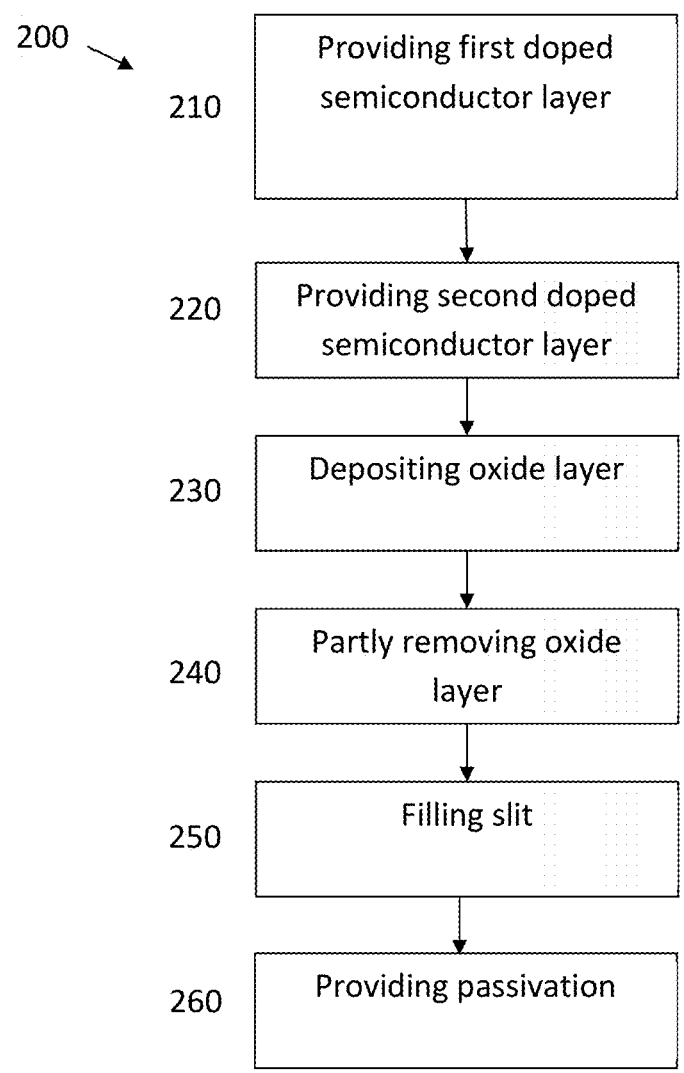

In a second aspect embodiments of the present invention relate to method 200 for manufacturing a semiconductor device. An example of such a method is illustrated in FIG. 12. Exemplary devices obtained using such a method are illustrated in FIG. 3, 9a, 9b and FIG. 11. The method comprises providing 210 a first doped semiconductor layer 112 and providing 220 a second doped semiconductor layer 122 wherein the first and second doped semiconductor layer are provided such that at least one electronic component is formed in the first and/or second semiconductor layer.

The method moreover comprises depositing 230 an oxide layer 127 over the second doped semiconductor layer 122 and over the first doped semiconductor layer 112.

The method moreover comprises removing 240 part of the oxide layer 127 to obtain a slit 123 in the oxide layer over the first doped semiconductor layer 112 and over the second doped semiconductor layer 122 and filling 250 the slit with a metal thereby creating an electrical interconnect 129 between the first doped semiconductor layer 112 and the second doped semiconductor layer 122.

In embodiments of the present invention a passivation layer 128 is provided 260 over the first and second doped semiconductor layers 112, 122 and over the oxide layer 127.

In embodiments of the present invention providing the first semiconductor layer comprises providing a substrate 110 which comprises a well 114 of a second conductivity type in a deep well 112 (the first doped semiconductor layer) of a first conductivity type opposite to the second conductivity type wherein at least one electronic component is provided in the well 114.

Providing the second semiconductor layer 122 comprises applying 220 a polysilicon shield 122 over the electronic component 115.

In embodiments of the present invention this step may be followed by a step wherein source drain implants and a silicide are formed simultaneously on the polysilicon and mono-silicon.

The oxide layer 127 may be deposited 230 over the polysilicon shield 122 and over the deep well 112, and part of the oxide layer 127 is removed 240 to obtain a slit 123 in the oxide layer over the deep well 112 and the polysilicon shield 122.

The slit is filled 250 with a metal thereby creating an electrical interconnect 129 between the polysilicon shield and the deep well, A passivation layer 128 is provided 260 over the well 114, and the conductive path 115.

The oxide layer 127 may for example be a high-density plasma (HDP) chemical vapor deposited oxide.

It is an advantage of embodiments of the present invention that the steps can be applied using standard CMOS processing followed by some special post processing steps to accomplish reliability in harsh media.

Steps 210 to 250 can be implemented using CMOS steps on a wafer of the second conductivity type up to the definition of the contacts with metal plugs for the first interconnection metal layer. Deep well diffusion of the first conductivity type may provide the electrical insulation of the electronic components, the diffusion of the second conductivity type may define the electronic components. The field oxide isolates the polysilicon shields from the electronic components and source drain implants can be used to create substrate contacts and to connect the electronic components with each other. A standard silicide process may provide contact areas and areas with high conductivity.

A HDP oxide may provide the first metal isolation and a damascene process is carried out to define metal filled contact slits 123 in the HDP oxide which are forming interconnects between the second semiconductor layer 122 (e.g. polysilicon shield) and the first semiconductor layer 112 (e.g. via substrate contacts 116). These interconnects are also referred to as metal plugs.

The advantage of this method is that standard CMOS processing can be used including polysilicon side wall passivation. In embodiments of the present invention the plugs are made of a metal which has as characteristics that it stays inert during a deposition of the passivation layer which can even be applied at high temperatures. The metal may for example be Tungsten. The passivation layer may even be a LPCVD nitride applied at a temperature of 830° C. Metals such as titanium and aluminium would react with the deposition gases silane and ammonia. Applying such heating to a CMOS circuit with copper as first metallization to temperatures above 830° C. will cause copper contamination in the p and n diffusions of the circuitry below the copper and then the device will not work anymore. Another advantage of the high temperature resistant metal plug (e.g. tungsten) is that it has a very small thermal expansion coefficient (4.5 ppm/° C.) similar to that of silicon (2.6 ppm/° C.). Therefore, this material will not introduce stress gradients in the materials around this metal as is the case for aluminium (CTE 24 ppm/° C.) or copper (CTE 17 ppm/° C.).

In step 260 the passivation layer is provided. This may be achieved by high temperature deposition 260 of a passivation layer to assure a stoichiometric structure with a minimum of dislocations and voids. This layer is indispensable to provide reliability in harsh media. In principle the LPCVD nitride deposition tool can be used that also defines the nitride used for masking the growing of the field oxide.

This step may be followed by non-CMOS steps of patterning the passivation layer to provide vias for the bondpads to the interconnect and the definition of bondpads covering these vias. Preferably these bondpads are made of a noble metal to resist harsh environments.

It is an advantage that no dedicated process control modules must be developed to monitor the quality of the mono-polysilicon contact during mass production.

FIG. 13 illustrates exemplary methods steps of a method for providing alternative interconnections (besides the metal filled slits in accordance with embodiments of the present invention) between the first and second doped semiconductor layer. The first box represents standard CMOS steps on wafer of the second conductivity type. A deep diffusion of the first conductivity type provides the electrical insulation of the electronic components 115, a diffusion of the second conductivity type defines the electronic components. The field oxide 120 isolates the polysilicon shields 122 from the electronic components 115 and source drain implants 116 are used to create substrate contacts and to connect the electronic components 115 with each other. An example of a device manufactured using this method is illustrated in FIGS. 7, 8a and 8b.

In embodiments of the present invention silicide contacts may be provided between the mono- and the polysilicon. This is achieved as indicated in the $2^{nd}$ box. The $2^{nd}$ box indicates that, in this example, the CMOS process needs to be modified in such a way that no sidewall protection is present before the silicide process is started. One could consider omitting the gate oxide processing to minimize the oxide thickness between the mono- and polysilicon. The method illustrated in FIG. 12 can be better integrated with processes for creating MOS transistors because in this method it is not required to skip the sidewall protection. The MOS transistors can be created on the same chip as the pressure sensor sensing elements.

The third box represents standard CMOS steps for forming a silicide 124 and HDP oxide. For the silicide process a silicide is created between the mono- and polysilicon at the edges of the polysilicon defined in areas without field oxide. The HDP oxide rounds the edges of the polysilicon and planarizes the surface. The use of chemical mechanical polishing (CMP) allows making perfectly flat surfaces but is not a necessary step.

The fourth box represents the high temperature deposition of the passivation layer 128 to assure a stoichiometric structure with a minimum of dislocations and voids. This layer is preferable to provide reliability in harsh media. In principle the LPCVD nitride deposition tool can be used that also defines the nitride used for masking the growing of the field oxide.

The last box represents the (non-CMOS) steps of patterning the passivation layer 128 to provide vias 131 for the bondpads 130 to the interconnect and the definition of bondpads 130 covering these vias 131. Preferably these bondpads 130 are made of a noble metal to resist harsh environments. An example of a stack implemented using this method is illustrated in FIG. 7.

The invention claimed is:

1. A semiconductor device comprising:
a first doped semiconductor layer, a second doped semiconductor layer, an oxide layer covering the first doped semiconductor layer and the second doped semiconductor layer, and comprising an interconnect,
wherein a first part of the interconnect is electrically connected with the first doped semiconductor layer and a second part of the interconnect is electrically connected with the second doped semiconductor layer and wherein a part of the interconnect between the first part and the second part crosses over a sidewall of the second doped semiconductor layer, wherein the interconnect comprises a metal filled slit in the oxide layer, and
wherein at least one electronic component is formed in the first and/or second semiconductor layer,
the semiconductor device moreover comprising a stoichiometric crystalline passivation layer which covers the first and second doped semiconductor layers, the oxide layer, and the interconnect.

2. The semiconductor device according to claim 1, comprising:
a well of a second conductivity type in a deep well of a first conductivity type or substrate of the first conductivity type opposite to the second conductivity type, wherein the deep well or substrate of the first conductivity type is realized in the first doped semiconductor layer,
wherein at least one of the electronic components is present in the well of the second conductivity type,
wherein the second semiconductor layer is present between the passivation layer and the electronic component, and
wherein the oxide layer is present over the second semiconductor layer, over the well and over the deep well or substrate of the first conductivity type.

3. The semiconductor device according to claim 2, comprising at least one conductive path connected between the at least one electronic component and at least one via which is connected through the passivation layer with a bondpad.

4. The semiconductor device according to claim 3, wherein the at least one conductive path comprises a highly doped path of the second conductivity type in the well.

5. The semiconductor device according to claim 3, wherein the at least one conductive path comprises a polysilicon layer between the electronic component and the at least one via.

6. The semiconductor device according to claim 5, wherein the polysilicon layer which is part of the conductive path is patterned.

7. The semiconductor device according to claim 3, wherein the at least one conductive path comprises metal filled slits parallel to a direction of a current when the current is flowing in the conductive path.

8. The semiconductor device according to claim 3, wherein the at least one conductive path comprises structured polycrystalline semiconductor material covered with a metal alloy.

9. The semiconductor device according to claim 1, the semiconductor device comprising a field oxide wherein the field oxide is present between the second doped semiconductor layer and the first doped semiconductor layer.

10. The semiconductor device according to claim 1, wherein the stoichiometric crystalline passivation layer comprises $Si_3N_4$ or diamond including carbon or diamond or SiC or $Al_2O_3$.

11. The semiconductor device according to claim 1, wherein the second doped semiconductor layer and/or the first doped semiconductor layer is at least partially covered with a metal alloy.

12. The semiconductor device according to claim 1, wherein the metal filled slit is electrically connected with the first doped semiconductor layer through a highly doped contact.

13. A method for manufacturing a semiconductor device, the method comprising:
providing a first doped semiconductor layer,
providing a second doped semiconductor layer,
wherein the first and second doped semiconductor layer are provided such that at least one electronic component is formed in the first and/or second semiconductor layer,
depositing an oxide layer over the second doped semiconductor layer and over the first doped semiconductor layer,
removing part of the oxide layer to obtain a slit in the oxide layer over the first doped semiconductor layer, over a sidewall of the second doped semiconductor layer, and over the second doped semiconductor layer,
filling the slit with a metal thereby creating an electrical interconnect between the first doped semiconductor layer and the second doped semiconductor layer,
providing a stoichiometric crystalline passivation layer over the first and second doped semiconductor layers, over the oxide layer, and over the interconnect.

14. The method according to claim 13, the method moreover comprising:
providing at least one conductive path starting from the at least one electronic component,
providing at least one via through the stoichiometric crystalline passivation layer such that the via is connected with the conductive path and with a bondpad on the via.

15. The method according to claim 14, wherein the conductive path is created by at least one metal filled slit.

* * * * *